United States Patent
Sugiura et al.

[19]

[11] Patent Number: 5,777,930
[45] Date of Patent: Jul. 7, 1998

[54] TEST POTENTIAL TRANSFER CIRCUIT

[75] Inventors: Yoshihisa Sugiura, Tokyo; Yoshihisa Iwata; Keniti Imamiya, both of Kanagawa-Ken, all of Japan

[73] Assignee: Kabushiki Kaisha Toshiba, Kanagawa-Ken, Japan

[21] Appl. No.: 881,870

[22] Filed: Jun. 24, 1997

Related U.S. Application Data

[63] Continuation of Ser. No. 308,041, Sep. 16, 1994, abandoned.

[30] Foreign Application Priority Data

Feb. 25, 1994 [JP] Japan .................. 6-027103

[51] Int. Cl.$^6$ .................................. G11C 7/00
[52] U.S. Cl. .................. 365/189.11; 365/191; 365/227
[58] Field of Search .................. 365/201, 189.11, 365/191, 227, 230.06

[56] References Cited

U.S. PATENT DOCUMENTS 5,369,491  11/1994  Han et al. ..................... 365/201
5,428,576  6/1995  Furuyama ..................... 365/201

*Primary Examiner*—Do Hyun Yoo
*Attorney, Agent, or Firm*—Pillsbury Madison & Sutro LLP

[57] ABSTRACT

A potential transfer circuit consists of a first pad, a second pad, a voltage detection circuit, a level shift circuit and a switching MOS transistor. The voltage detection circuit is connected to the first pad and detects a high voltage applied to the first pad and generates a control signal which is supplied to the level shift circuit. The level shift circuit receives the control signal and generates a drive signal which is in turn supplied to the gate of the MOS transistor, causing the MOS transistor to supply to a circuit under test a test signal supplied through the second pad to the drain of the MOS transistor. In preferred embodiments, the power supply of the level shift circuit is derived from the high voltage signal supplied to the first pad.

19 Claims, 5 Drawing Sheets

TEST POTENTIAL TRANSFER CIRCUIT

This is a continuation of application Ser. No. 08/308,041, filed Sep. 16, 1994, now abandoned.

FIELD OF THE INVENTION

The present invention relates to test circuitry and, more particularly, to a semiconductor memory device having a circuit for providing a variable high voltage test potential to word lines within the memory device during a testing operation.

BACKGROUND OF THE INVENTION

Nonvolatile semiconductor memory devices which utilize low power supply voltages, for example, 3.3 Volts, are typically equipped with a voltage multiplier circuit for generating certain internal operating voltages. A voltage multiplier circuit is used to step up the voltage $V_{CC}$ of an external power supply ($V_{CC}$=3.3 Volts) to an internal "boosted" voltage $V_{PP}$ (e.g. $V_{PP}$=10 Volts) which is applied to word lines during certain normal operations, for example, during read operations. In conventional memory devices, the voltage $V_{PP}$ is fixed by a voltage control circuit connected to the output terminal of the voltage multiplier circuit. Thus, it is often impossible to externally control the voltage to which $V_{PP}$ is set.

During chip test, such as that typically carried out after the completion of processing, it may be desirable to apply a variable test voltage (e.g., a Vtest of between 4 and 7 Volts) to the word lines of the semiconductor memory device. To apply such a variable test voltage, a test potential transfer circuit capable of transferring a variable test potential is required in addition to the voltage multiplier circuit normally provided in the memory device. It is further desirable that the test potential transfer circuit not introduce voltage drops into the variable test potential so that the test potential can be carefully controlled.

A conventional test potential transfer circuit includes a switching MOS transistor, the drain of which is connected to a test potential pad, and an additional voltage multiplier circuit connected to the gate of the switching MOS transistor. This additional voltage multiplier circuit is distinct from the voltage multiplier circuit normally provided in conventional memory devices. The additional multiplier circuit is required to avoid a threshold voltage drop, normally associated with the switching MOS transistor, and to make it possible to transfer a variable test potential Vtest that is higher than the power supply potential $V_{CC}$. Therefore, the prior art test potential transfer circuit generally includes a voltage multiplier circuit in addition to that normally required in the semiconductor memory device.

As described above, the prior art test potential transfer circuit includes the additional voltage multiplier circuit to avoid the threshold voltage drop of the switching MOS transistor. The use of an additional voltage multiplier requires the presence on the chip of a number of capacitors connected to form a charge pump circuit, which charge pump circuit undesirably occupies a large area on the chip. It is therefore desirable to avoid the use of the additional voltage multiplier circuit, so that the density of the semiconductor memory device can be increased.

SUMMARY OF THE PREFERRED EMBODIMENTS

Particularly preferred embodiments of the present invention provide a test potential transfer circuit having a voltage detection circuit, a level shift circuit and a switching circuit element. The voltage detection circuit is connected to a control node, detects a high voltage applied to the control node and generates a control signal. The level shift circuit receives the control signal and generates a drive signal. The power supply for the level shift circuit is provided at the control node. In particularly preferred embodiments of the present invention, the switching circuit element may be a MOS transistor. In such embodiments, the drain of the MOS transistor is connected to a signal node and the gate of the MOS transistor is driven by the drive signal.

During a test procedure utilizing a further aspect of a preferred embodiment of the present invention, a control signal is generated by detecting the high voltage applied to the control node. At the same time, the high voltage applied to the control node supplies power to the level shift circuit, making it possible to form a test potential transfer circuit without incorporating a dedicated voltage multiplier circuit.

DETAILED DESCRIPTION OF PREFERRED EMBODIMENTS

Figure 1:
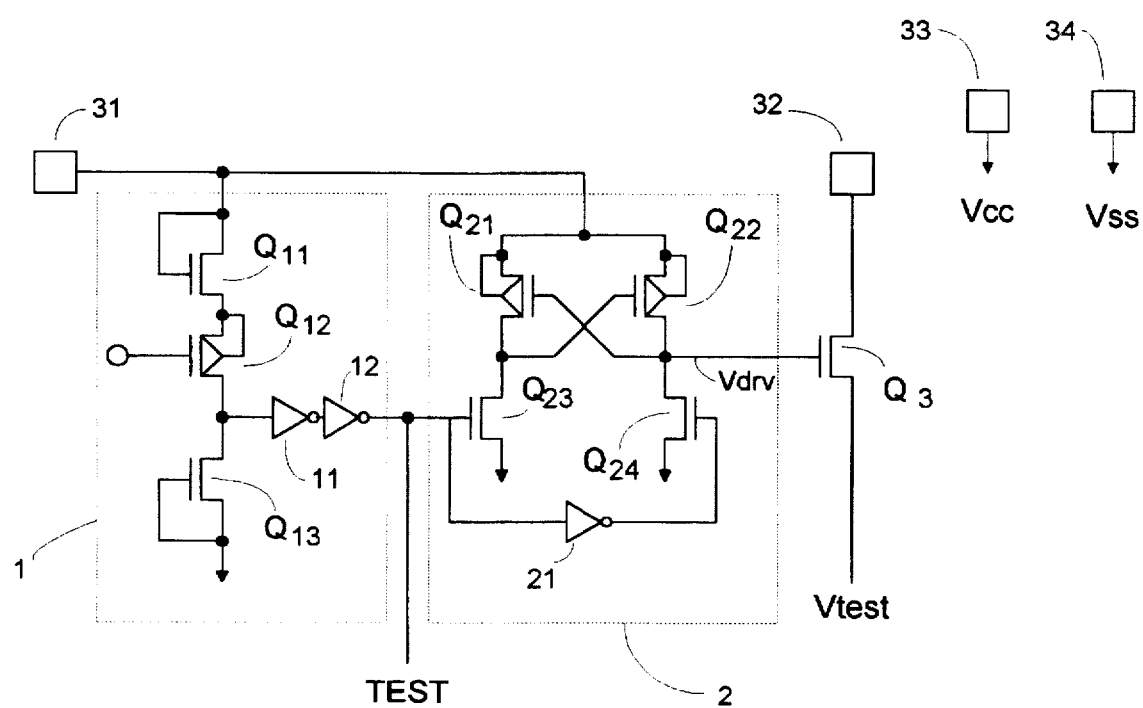
FIG. 1 is a circuit diagram showing a preferred embodiment of a test potential transfer circuit according to the present invention.

Preferred embodiments of the present invention will be described hereinafter with reference to the attached drawings. FIG. 1 shows a preferred embodiment of a test potential transfer circuit according to the present invention consisting of a test control pad 31, a test signal pad 32, a high voltage detection circuit 1, a level shift circuit 2, and a switching circuit element. In the illustrated embodiment, the switching circuit element is an N-channel MOS transistor $Q_3$. A user triggers a test mode of the FIG. 1 circuit by applying a high voltage to the test control pad 31. The voltage detection circuit 1 detects the presence of a high voltage test control signal at pad 31 and generates a control signal TEST which is provided both to circuits undergoing test and to the level shift circuit 2. The TEST control signal causes the level shift circuit 2 to switch to a mode in which the level shift circuit provides the high voltage test control signal from pad 31 to the gate of switching MOS transistor $Q_3$. When the test control signal supplied at pad 31 has an appropriately high voltage, the switching MOS transistor $Q_3$ passes the signal provided at test signal pad 32 to circuitry undergoing test without introducing a voltage drop to the test control signal. When the circuit illustrated in FIG. 1 is being used to control a test, an external test signal is supplied to the test signal pad 32 which is higher (e.g., 4 to 7 Volts) than the normal power supply voltage $V_{CC}$ for the circuit (e.g., 3.3 Volts). The test potential transfer circuit of FIG. 1 further comprises a power supply terminal 33 for receiving an externally supplied power supply potential $V_{CC}$ and a ground terminal 34 for receiving an externally supplied ground potential $V_{SS}$. $V_{CC}$ and $V_{SS}$ are distributed to most of the internal circuits including the inverters 11, 12 and 21.

The high voltage detection circuit 1 detects when a high voltage is applied to the test control pad 31, and generates a control signal TEST when an appropriate high voltage is present. As shown in FIG. 1, the high voltage detection circuit comprises an N-channel MOS transistor $Q_{11}$, a P-channel MOS transistor $Q_{12}$, an N-channel MOS transistor $Q_{13}$, and inverters 11 and 12. Transistors $Q_{11}$, $Q_{12}$, $Q_{13}$ are connected in series between the test control pad 31 and a ground potential terminal. Taken together, transistors $Q_{11}$, $Q_{12}$, $Q_{13}$ function as a voltage divider which divides the high voltage applied at the test control pad 31 down to an amplitude approximately equal to $V_{CC}$ at the input to inverters 11 and 12. Inverters 11 and 12 receive the divided voltage and generate the control signal TEST, which typically has an amplitude of $V_{CC}$. In this way, the high voltage applied to the test control pad 31 is used as a "signal" that indicates that circuit testing is to be performed. On the other hand, when a signal having an insufficient voltage is applied to the test control pad 31, the divided voltage present at the input to inverters 11 and 12 will be too low to cause the inverters 11 and 12 to switch, so that no TEST signal is generated. Such signals of insufficient voltage may be applied to the test control pad 31 when pad 31 is being used for a purpose other than for test control. For example, pad 31 might be used to perform chip select, write protect or any number of other functions, all of which would cause low voltage signals (of approximately 0 V to $V_{CC}$) to be applied to pad 31. High voltage detection circuit 1 does not detect such signals, and the value of the TEST signal will be inactive or low.

Level shift circuit 2 receives the control signal TEST from the high voltage detection circuit 1 and the level shift circuit 2 in turn generates a drive signal Vdrv, which is preferably used to control a switching circuit element. In the embodiment illustrated in FIG. 1, the signal Vdrv is provided from the level shift circuit 2 to the gate of a switching MOS transistor $Q_3$. The level shift circuit 2 comprises P-channel MOS transistors $Q_{21}$ and $Q_{22}$ and N-channel MOS transistors $Q_{23}$ and $Q_{24}$. The sources of the transistors $Q_{21}$ and $Q_{22}$ are connected in common to the test control pad 31 so that power for the level shift circuit 2 is derived from the test control pad 31. As illustrated in FIG. 1, the level shift circuit is configured so that the amplitude of drive signal Vdrv is the amplitude of the high voltage signal applied to the test control pad 31 when the high voltage detection circuit generates a high value for the signal TEST. In such a case, $Q_{23}$ is on, $Q_{24}$ is off, $Q_{22}$ is on and $Q_{21}$ is off. The Vdrv output is pulled to the voltage at the test control pad 31 by the channel to gate capacitance of $Q_{21}$. Thus, the high voltage applied to the test control pad 31 is used as a "power source" for the test control circuit. When detection circuit 1 has not detected a high voltage at pad 31, the low value of the TEST signal supplied to inverter 21 causes N-channel FET $Q_{24}$ to switch on, which pulls the signal Vdrv to ground. Accordingly, MOS transistor $Q_3$ will not switch on unless an appropriate high voltage test control signal (as determined by the voltage detection circuit 1) is supplied to pad 31.

The drain of switching MOS transistor $Q_3$ is connected to the test signal pad 32 and the gate of switching transistor $Q_3$ is connected to the level shift circuit 2 so that the gate of $Q_3$ is driven by the drive signal Vdrv. As discussed above, the drive signal Vdrv has the same amplitude as the high voltage test control signal supplied to pad 31. When a sufficiently high voltage Vdrv is generated by the level shift circuit 2, the variable externally supplied test signal of four to seven Volts is transferred from the pad 32 to the circuit under test without a threshold drop. The N-channel MOS transistor illustrated in FIG. 1 is particularly preferred as a switching circuit element because of its comparatively high current capabilities for a given size device. Such an N-channel MOS transistor will not introduce a voltage drop to the test signal so long as the voltage Vdrv applied to the gate of $Q_3$ is greater than or equal to the sum of the maximum voltage of the test signal plus the threshold voltage of $Q_3$ ($V_G \geq V_D + V_T$). Accordingly, for typical threshold voltages of about one and one half Volts and test signals of between four and seven Volts, a Vdrv of approximately ten Volts is sufficient to ensure that $Q_3$ does not introduce a voltage drop. It follows then that, for the circuit illustrated in FIG. 1, a test control signal supplied to pad 31 of approximately ten Volts is sufficient to ensure that the illustrated circuit transfers the test potential provided at pad 32 without a voltage drop.

With the structure shown above, in a test mode, the control signal TEST is generated by detecting the high voltage applied to the test control pad 31 and, at the same time, the high voltage is used for the power supply of the level shift circuit 1, making it possible to form a potential transfer circuit without an additional voltage multiplier circuit. Therefore, necessary chip area is greatly reduced. Additionally, with the structure shown above, a user-determined, variable test potential can be transferred, without a threshold drop, into the internal portions of the chip. The illustrated embodiment of the present invention allows carefully controlled test voltages to be accurately provided to circuit elements undergoing test.

Figure 2:
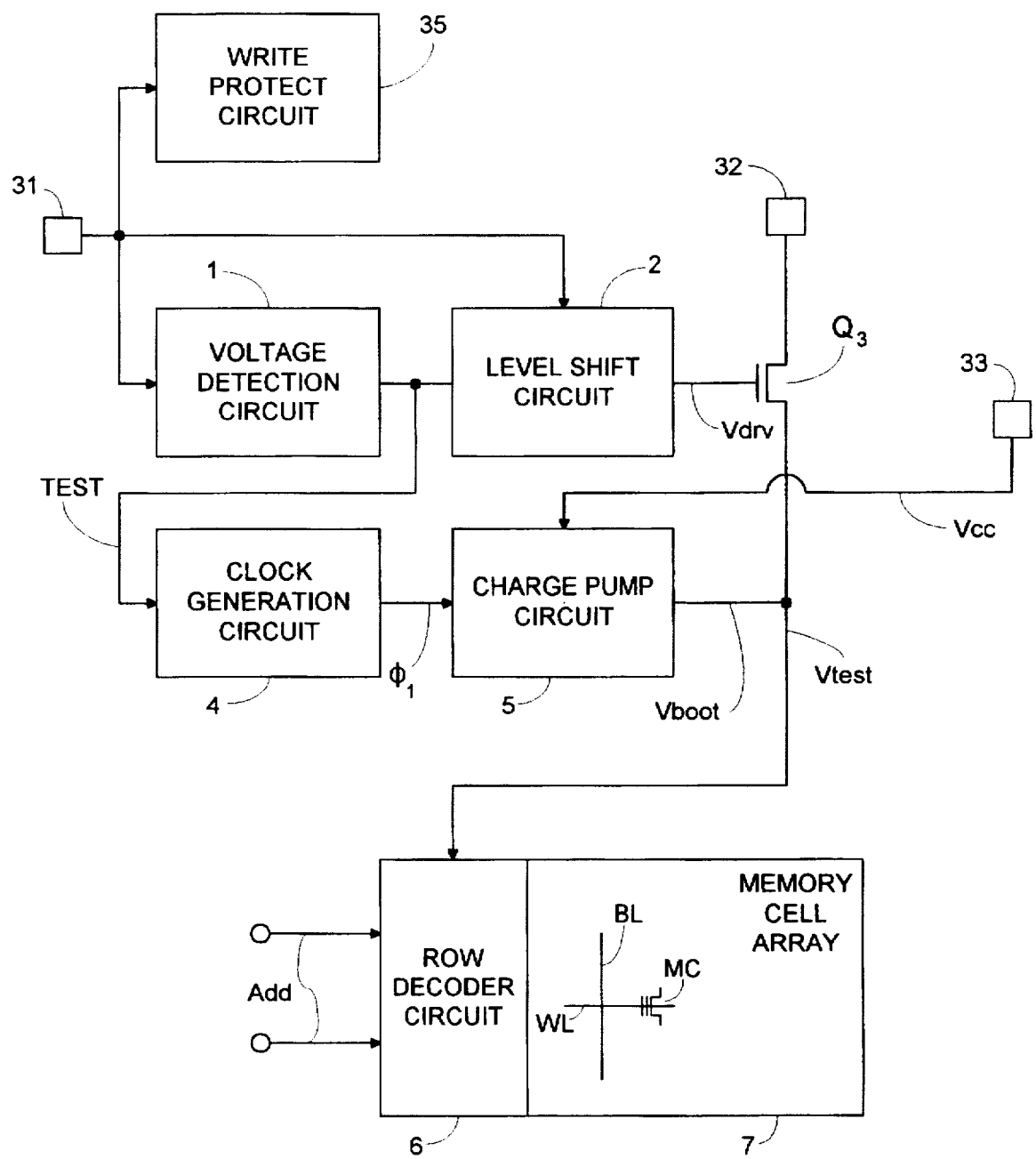
FIG. 2 is a circuit diagram showing an example of a semiconductor memory device utilizing the test potential transfer circuit shown in FIG. 1.

FIG. 2 shows an example of a semiconductor memory device utilizing the test potential transfer circuit described above. The semiconductor memory device illustrated in FIG. 2 comprises a test control pad 31, a test signal pad 32, a high voltage detection circuit 1, a level shift circuit 2, a switching MOS transistor $Q_3$, a clock generation circuit 4, a charge pump circuit 5, a row decoder circuit 6 and a memory cell array 7. As is well known for such memory devices, address signals Add are provided to the row decoder 6 which causes different memory cells (MC) to be accessed within the memory cell array 7. In this embodiment, access to portions of the memory cell array is accomplished through an array of word lines (WL) and an array of bit lines (BL). The test control pad 31, the test signal pad 32, the high voltage detection circuit 1, the level shift circuit 2 and the switching MOS transistor $Q_3$ can be the same as the ones shown in FIG. 1. Therefore, no further description of these elements is provided here.

Figure 3:
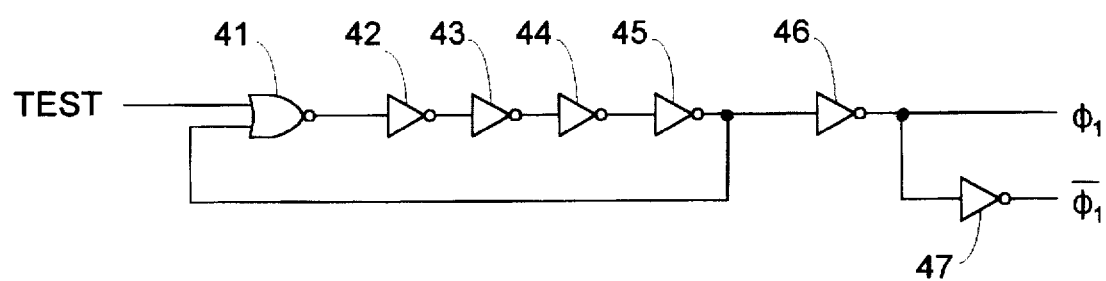
FIG. 3 is a circuit diagram showing an example of a voltage multiplier circuit for use in the semiconductor memory device shown in FIG. 2.
Figure 4:
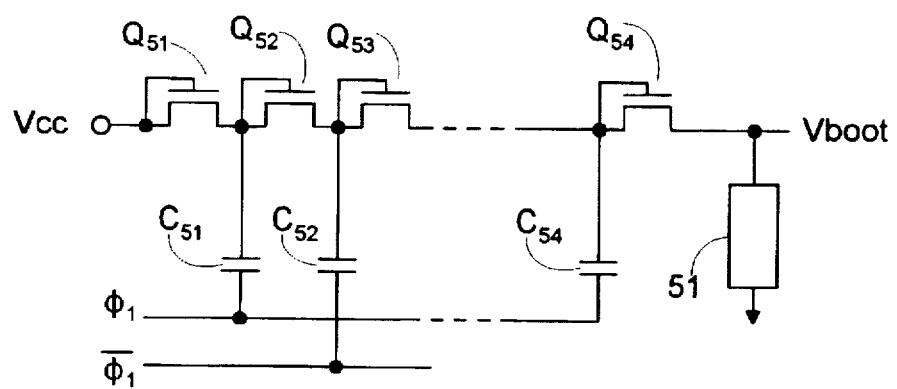
FIG. 4 is a circuit diagram showing an example of a charge pump circuit for use in the semiconductor memory device shown in FIG. 2.

Clock generation circuit 4 generates a clock signal $\phi_1$ and an inverted clock signal $\bar{\phi}_1$ (not shown in FIG. 2) under the control of the TEST signal. As shown in FIG. 3, the clock generation circuit 4 comprises a NOR gate 41 and inverters 42–47. The NOR gate 41 and inverters 42–45 form a ring oscillator circuit. Inverter 46 rectifies the output of the ring oscillator to produce a typical square wave clock signal. Referring again to FIG. 2, charge pump circuit 5 steps up an externally supplied power voltage $V_{CC}$ up to a voltage of, e.g., 10 Volts; this internally boosted voltage Vboot is distributed to the word lines of the memory cell array 7. As shown in FIG. 4, the charge pump circuit 5 comprises: transistors $Q_{51}$, $Q_{52}$, $Q_{53}$ and $Q_{54}$, capacitors $C_{51}$, $C_{52}$ and $C_{54}$, and a voltage control circuit 51. The capacitor terminals are driven by the clock signals $\phi_1$ and $\bar{\phi}_1$. Clock generation circuit 4 and charge pump circuit 5 together form a voltage multiplier circuit. The multiplier circuit is enabled when the TEST signal is in an inactive state and disabled when the TEST signal is in an active state. Therefore, in the test mode, the voltage multiplier circuit is disabled, which effectively prevents a conflict from arising between Vboot and Vtest. Vtest is transferred to the row decoder circuit 6 only when an active value of TEST is generated by the high voltage detection circuit 1 and Vboot is only generated when TEST has a low, inactive value (e.g., Vtest≦$V_{CC}$).

Figure 5:
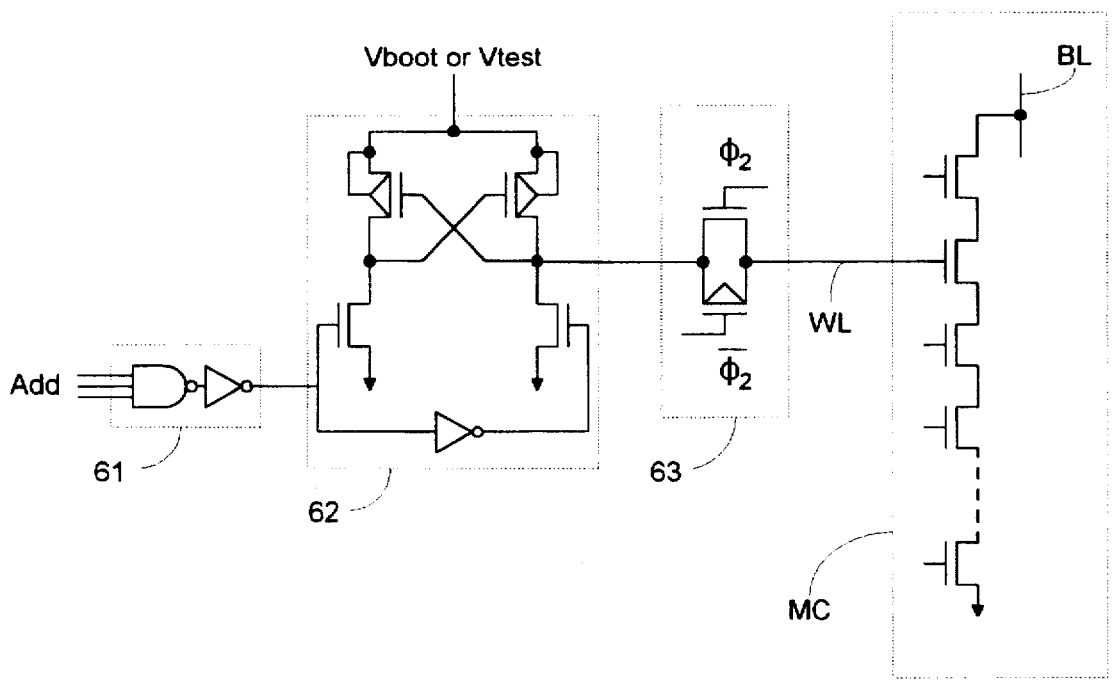
FIG. 5 is a circuit diagram showing a row decoder circuit and memory cells for use in the semiconductor memory device shown in FIG. 2.

FIG. 5 shows in greater detail an example of the row decoder circuit 6 shown in FIG. 2, as well as one part of the memory cell array 7 shown in FIG. 2. The row decoder circuit 6 distributes the voltage Vboot or Vtest to the word lines WL. As shown in FIG. 5, the row decoder circuit comprises: an address decoder circuit 61 for receiving externally supplied address signals and for generating a first selection signal; a level shift circuit 62 for receiving the Vboot or the Vtest and for generating a word line drive signal having the amplitude of the voltage Vboot or Vtest; and a transfer gate 63 controlled by a second selection signal generated by a predecoder circuit (not shown). The memory cell array 7 comprises: a plurality of word lines WL; a plurality of bit lines BL; and a plurality of memory cells MC arranged in a matrix. The memory cells in the illustrated example are NAND type nonvolatile memory cells. A NAND cell consists of a first select transistor connected to a bit line, a second select transistor connected to a ground potential terminal and eight or sixteen floating gate MOS transistors connected in series between the first selection transistor and the second selection transistor. Since the cell current of a NAND type memory cell tends to be smaller than that used in other types of memory cells, NAND cell memory arrays require a higher and more variable test potential to obtain a complete test evaluation. This means that a test transfer circuit in accordance with the present invention is preferred for the testing of such NAND cell memory arrays.

Next, the operation of the semiconductor memory device in FIG. 2 will be described. During normal operation (e.g., during a read operation), the test control pad 31 is used as a signal I/O terminal. The amplitude of the signal applied to the pad 31 during normal operation is $V_{CC}$, which may be, e.g., 3.3 Volts. For example, a write protect control signal $\overline{Wp}$ may be applied to the pad 31 and thereby to a write protect circuit 35 which prevents a write (or program) operation from occurring. During normal operation, a high level voltage, i.e., greater than $V_{CC}$, is preferably not applied to the test control pad 31. Thus, during normal operation, the TEST signal is held at a low value "L", and the drive signal is held at Vdrv=0 Volts. Accordingly, the test signal pad 32 is isolated and the row decoder circuit 6 is not connected to the test signal pad 32. In this mode of operation, the clock generation circuit 4 is enabled to generate clock signals and the charge pump circuit 5 steps up the external power supply voltage $V_{CC}$ to the boosted internal voltage Vboot. The voltage Vboot is transferred to selected word lines WL by the row decoder circuit 6.

By contrast, during a test operation (e.g., during a read test for detecting a read margin), the user triggers a test operation by applying a high voltage of approximately ten Volts to the test control pad 31. In this sense, the term "high voltage" refers to a voltage signal in excess of the typical operating voltage $V_{CC}$. A high voltage signal is one of sufficient magnitude to be detected by the high voltage detection circuit 1 (FIG. 1). Referring to the FIG. 1 embodiment, a high voltage signal is one of sufficient magnitude that, when applied to the pad 31, the voltage output from inverter 12 is sufficiently close to $V_{CC}$ to be recognized as a valid logic signal. The high voltage detection circuit 1 detects a high voltage at pad 31 and generates a TEST signal having a high "H" level of approximately $V_{CC}$. It is further preferred that the high voltage signal be of sufficiently high voltage to cause the switching circuit element to transfer the test potential provided at pad 32 to an internal portion of the circuit without a voltage drop. In the embodiment illustrated in FIG. 2, this requirement corresponds to the high voltage supplied to pad 31 being sufficient to generate a sufficient voltage of Vdrv to cause transistor $Q_3$ to transfer the test potential without introducing a voltage drop. The TEST signal is amplified by the level shift circuit 2 to generate a drive signal Vdrv having an amplitude approximately equal to the test control signal supplied to pad 31. Thus, when the test control signal is ten Volts, then Vdrv is ten Volts, so that MOS transistor $Q_3$ transfers a test potential Vtest, preferably between four and seven Volts, to the row decoder circuit 6. The test voltage Vtest is then the power supply for the level shift circuit 62 (FIG. 5), which causes the word line WL (FIG. 5) to be driven with the test signal Vtest. Thus, when the high voltage signal is supplied as a test control signal to pad 31, the read test is conducted.

As described above, the configuration shown in FIG. 2 reduces the number of pads and external leads needed for testing, as compared to the conventional circuit configuration. Further, in the test mode, the control signal TEST is generated by detecting the high voltage applied to the test control pad 31, and the same high voltage supplies power to the level shift circuit 1, making it possible to form a potential transfer circuit without an additional voltage multiplier circuit. Therefore, the necessary chip area is reduced in comparison to conventional test circuit configurations. Moreover, in accordance with preferred embodiments of the present invention, a user-determined, variable test potential can be provided, with no threshold voltage drop, to internal portions of a chip. Because the test potential is distributed within the chip by the row decoder, it is possible to control the word line potential from a point external to the chip during a testing operation (e.g., a read test operation). Further, the control signal TEST does not have a high voltage amplitude, which makes it possible to use the TEST control signal to control other circuit elements. In the illustrated embodiment, TEST controls the generation of the clock signal so that conflicts between the boosted internal voltage Vboot and the test voltage Vtest can be prevented.

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. A semiconductor device comprising:
   a first pad;
   a second pad;
   a voltage detection circuit coupled to the first pad, wherein the voltage detection circuit generates a control signal in response to a high voltage signal detected at the first pad;
   a level shift circuit coupled to the voltage detection circuit, wherein the level shift circuit generates a drive signal in response to the control signal, and wherein a power supply terminal of the level shift circuit is connected to the pad;
   a MOS transistor comprising a drain coupled to the second pad and a gate coupled to the level shift circuit so that the gate of the MOS transistor is driven by the drive signal generated by the level shift circuit; and an internal circuit controlled by the control signal, wherein the internal circuit is a voltage multiplier circuit for stepping up an externally supplied power supply potential into a boosted potential, and wherein the operation of the voltage multiplier circuit is controlled by the control signal to prevent conflicts with a voltage signal generated by the voltage multiplier circuit.

2. A semiconductor device comprising:

a first pad;

a second pad;

a voltage detection circuit coupled to the first pad, wherein the voltage detection circuit generates a control signal in response to a high voltage signal applied to the first pad;

a level shift circuit coupled to the voltage detection circuit, wherein the level shift circuit generates a drive signal in response to the control signal, and wherein a power supply terminal of the level shift circuit is connected to the first pad;

a MOS transistor comprising: a source; a drain coupled to the second pad; and a gate coupled to the level shift circuit so that the gate of the MOS transistor is driven by the drive signal generated by the level shift circuit;

a memory cell array having a plurality of word lines connected to a plurality of memory cells, wherein the source of the MOS transistor is coupled to the plurality of word lines; and a voltage multiplier circuit for stepping up an externally supplied power supply potential into a boosted potential, wherein the operation of the voltage multiplier circuit is controlled by the control signal, and wherein the boosted potential is applied to one of the word lines.

3. The semiconductor device according to claim 2 wherein the control signal switches the voltage multiplier circuit into a mode of operation having reduced power consumption.

4. A potential transfer circuit comprising:

a control node;

a signal node;

a voltage detection circuit connected to the control node, the voltage detection circuit generating a digital control signal whose value indicates whether a high voltage signal is present at the control node;

a level shift circuit for generating a drive signal by shifting the logic level of the control signal, when the digital control signal indicates that the high voltage signal is present at the control node; and a MOS transistor having a drain terminal coupled to the signal node and a gate terminal coupled to the level shift circuit, the gate terminal of the MOS transistor being driven by the drive signal generated by the level shift circuit, wherein a power terminal of the level shift circuit is connected to the control node so that the drive signal generated by the level shift circuit is at substantially the same level as the control node when the high voltage signal is present at the control node, the digital control signal is at either a reference potential or a power source potential, the level of the high voltage signal is greater than the power source potential so that the level of the drive signal ($V_{drv}$) is greater than the power source potential when the high voltage signal is present at the control node, and the MOS transistor is an N-channel MOS transistor so that when the high voltage signal is present at the control node, a signal present at the signal node is transferred to a source terminal of the MOS transistor substantially without a voltage drop as long as the level of the signal at the signal node ($V_s$) is lower than the level of the drive signal minus the threshold voltage of the N-channel MOS transistor ($V_s < V_{drv} - V_{th}$).

5. A potential transfer circuit comprising:

a control node;

a signal node;

a voltage detection circuit connected to the control node, the voltage detection circuit generating a digital control signal whose value indicates whether a high voltage signal is present at the control node;

a level shift circuit for generating a drive signal by shifting the logic level of the control signal, when the digital control signal indicates that the high voltage signal is present at the control node; and a MOS transistor having a drain terminal coupled to the signal node and a gate terminal coupled to the level shift circuit, the gate terminal of the MOS transistor being driven by the drive signal generated by the level shift circuit, wherein a power terminal of the level shift circuit is connected to the control node so that the drive signal generated by the level shift circuit is at substantially the same level as the control node when the high voltage signal is present at the control node, the digital control signal is at either a reference potential or a power source potential, the level of the high voltage signal is greater than the power source potential so that the level of the drive signal ($V_{drv}$) is greater than the power source potential when the high voltage signal is present at the control node, the MOS transistor is an N-channel MOS transistor, and the level of the high voltage signal ($V_h$) is made greater than the maximum level of a signal applied to the signal node ($V_{s\text{-}max}$) plus the threshold voltage of the N-channel MOS transistor ($V_h > V_{s\text{-}max} + V_{th}$) so that when the high voltage signal is present at the control node, the signal applied to the signal node is transferred to a source terminal of the MOS transistor substantially without a voltage drop.

6. A potential transfer circuit comprising:

a control node;

a signal node;

a voltage detection circuit connected to the control node, the voltage detection circuit generating a control signal in response to a high voltage signal detected at the control node;

a level shift circuit coupled to the voltage detection circuit, the level shift circuit generating a drive signal in response to the control signal, the drive signal being generated by shifting the logic level of the control signal, and the level shift circuit being powered by the control node so that when the high voltage signal is detected at the control node, the level of the drive signal generated by the level shift circuit is substantially equal to the level of the high voltage signal; and a MOS transistor having a drain coupled to the signal node and a gate coupled to the level shift circuit so that the gate of the MOS transistor is driven by the drive signal generated by the level shift circuit, wherein the MOS transistor is an N-channel MOS transistor, and when the high voltage signal is present at the control node, a signal present at the signal node is transferred to a source terminal of the MOS transistor substantially without a voltage drop as long as the level of the signal at the signal node ($V_s$) is lower than the level of the drive signal ($V_{drv}$) minus the threshold voltage of the N-channel MOS transistor ($V_s < V_{drv} - V_{th}$).

7. The potential transfer circuit according to claim 6 wherein the control node is an I/O pad on a chip and the signal node is an I/O pad on a chip.

8. The potential transfer circuit according to claim 6 further comprising a memory cell array having a plurality of word lines connected to a plurality of memory cells, the source of the MOS transistor being coupled to the plurality of word lines.

9. The potential transfer circuit according to claim 8 wherein the memory cells are NAND type memory cells.

10. The potential transfer circuit according to claim 8 further comprising a row decoder circuit for distributing a potential from the source of the MOS transistor to the word lines.

11. The potential transfer circuit as defined in claim 6, wherein the voltage detection circuit includes a voltage divider and at least one invertor.

12. The potential transfer circuit according to claim 6, wherein the voltage detection circuit comprises a voltage divider and at least two invertors.

13. A potential transfer circuit comprising:

a control node;

a signal node;

a voltage detection circuit connected to the control node, the voltage detection circuit generating a control signal in response to a high voltage signal detected at the control node;

a level shift circuit coupled to the voltage detection circuit, the level shift circuit generating a drive signal in response to the control signal, the drive signal being generated by shifting the logic level of the control signal, and the level shift circuit being powered by the control node so that when the high voltage signal is detected at the control node, the level of the drive signal generated by the level shift circuit is substantially equal to the level of the high voltage signal; and a MOS transistor having a drain coupled to the signal node and a gate coupled to the level shift circuit so that the gate of the MOS transistor is driven by the drive signal generated by the level shift circuit, wherein the MOS transistor is an N-channel MOS transistor, and the level of the high voltage signal ($V_h$) is made greater than the maximum level of a signal applied to the signal node ($V_{s-max}$) plus the threshold voltage of the N-channel MOS transistor ($V_h > V_{s-max} + V_{th}$) so that when the high voltage signal is present at the control node, the signal applied to the signal node is transferred to a source terminal of the MOS transistor substantially without a voltage drop.

14. The potential transfer circuit according to claim 13 wherein the control node is an I/O pad on a chip and the signal node is an I/O pad on a chip.

15. The potential transfer circuit according to claim 13 further comprising a memory cell array having a plurality of word lines connected to a plurality of memory cells, the source of the MOS transistor being coupled to the plurality of word lines.

16. The potential transfer circuit according to claim 15 wherein the memory cells are NAND type memory cells.

17. The potential transfer circuit according to claim 15 further comprising a row decoder circuit for distributing a potential from the source of the MOS transistor to the word lines.

18. The potential transfer circuit as defined in claim 13, wherein the voltage detection circuit includes a voltage divider and at least one invertor.

19. The potential transfer circuit according to claim 13, wherein the voltage detection circuit comprises a voltage divider and at least two invertors.

* * * * *